US008881071B2

(12) United States Patent
Singh et al.

(10) Patent No.: US 8,881,071 B2
(45) Date of Patent: Nov. 4, 2014

(54) PHOTOLITHOGRAPHY MASK DESIGN SIMPLIFICATION

(75) Inventors: Vivek K. Singh, Portland, OR (US); Bikram Baidva, Hillsboro, OR (US); Omkar S. Dandekar, Hillsboro, OR (US); Hale Erten, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/977,644

(22) PCT Filed: Dec. 29, 2011

(86) PCT No.: PCT/US2011/067955

§ 371 (c)(1), (2), (4) Date: Apr. 25, 2014

(87) PCT Pub. No.: WO2013/101118

PCT Pub. Date: Jul. 4, 2013

(65) Prior Publication Data

US 2014/0237434 A1    Aug. 21, 2014

(51) Int. Cl.
*G06F 17/50* (2006.01)
*G03F 1/36* (2012.01)

(52) U.S. Cl.
CPC ..................................... *G03F 1/36* (2013.01)
USPC ............... 716/54; 716/51; 716/53; 716/55

(58) Field of Classification Search
USPC ................................................. 716/51, 53–55
See application file for complete search history.

(56) References Cited

U.S. PATENT DOCUMENTS

| 6,338,922 | B1 | 1/2002 | Liebmann et al. |
| 7,018,746 | B2 * | 3/2006 | Cui et al. ............................ 430/5 |
| 7,115,343 | B2 * | 10/2006 | Gordon et al. ..................... 430/5 |
| 7,376,930 | B2 * | 5/2008 | Wampler et al. ................. 716/54 |
| 7,512,927 | B2 * | 3/2009 | Gallatin et al. .................. 716/51 |
| 7,565,633 | B2 | 7/2009 | Mukherjee et al. |
| 7,745,067 | B2 * | 6/2010 | Blatchford et al. ............... 430/5 |
| 7,799,487 | B2 | 9/2010 | Hamouda |
| 8,601,406 | B2 * | 12/2013 | Bang ................................ 716/55 |
| 2009/0064085 | A1 * | 3/2009 | Bang ................................ 716/21 |
| 2009/0191468 | A1 * | 7/2009 | Crouse et al. ..................... 430/5 |
| 2010/0099032 | A1 | 4/2010 | Zou et al. |
| 2010/0325591 | A1 * | 12/2010 | Lippincott et al. .............. 716/54 |

OTHER PUBLICATIONS

PCT Search Report, PCT/US2011/067955, Intel Corporation et al., Sep. 27, 2012, 8 pages.

* cited by examiner

*Primary Examiner* — Naum B Levin
(74) *Attorney, Agent, or Firm* — Blakely, Sokoloff, Taylor & Zafman LLP

(57) ABSTRACT

A photolithography mask design is simplified. In one example, a target mask design is optimized for a photolithography mask. Medial axes of the design and assist features on the optimized mask are identified. These are simplified to lines. Lines that are distant from a respective design feature are pruned. The remaining lines are simplified and then thickened to form assist features.

20 Claims, 6 Drawing Sheets

PHOTOLITHOGRAPHY MASK DESIGN SIMPLIFICATION

CROSS-REFERENCE TO RELATED APPLICATION

This patent application is a U.S. National Phase Application under 35 U.S.C. §371 of International Application No. PCT/US2011/067955, filed Dec. 29, 2011, entitled "PHOTOLITHOGRAPHY MASKS DESIGN SIMPLIFICATION".

FIELD

The present description relates to the field of photolithography mask design and, in particular, to simplifying a mask design prior to its use.

BACKGROUND

Electronic and micromechanical devices are formed by patterning successive layers on a substrate using lithography. The patterns are formed by applying a layer of photoresist to a surface. Light is then passed through a patterned imaging plate, such as a mask or reticle, to expose the photoresist in patterns that correspond to the desired features on the substrate. A developer is applied and the photoresist is etched away leaving only the features in a pattern corresponding to the pattern on the mask. As the size of the features, such as parts of transistors, decreases, there are more features on the same size mask and the mask designs becomes more complex.

For very small features aggressive Optical Proximity Correction (OPC) or Inverse Lithography (ILT) is used when designing a mask in order to achieve a sufficiently high resolution to produce the small features. These mask design technologies can result in mask layouts that cannot be manufactured using conventional mask manufacturing technologies. One limitation of current mask making tools is a restriction on the number of shots used to make the mask. Shots are rectangles that the mask making tool uses to transfer geometry onto the mask. The restrictions can come in the form of total number of shots, shot density or total write time which is directly related to total shots.

Curved lines in particular have a large number of shots typically making them unmanufacturable. To manufacture a curve, the mask preprocessing tool fractures the mask layout into a large number of small rectangular tiles meaning that the curve has a very high shotcount. In addition, an aggressive mask design may not obey other mask making constraints like minimum edge to edge or corner to corner distances.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Embodiments of the present invention provide a way to use aggressive optimization techniques on a mask design that is still easy to manufacture. Manufacturability constraints may be met and shotcount reduced while still using OPC ILT or other optimization techniques. In one embodiment a medial axis based geometry simplifier reduces the shotcount of a resulting mask. In one embodiment, a distance based geometric pruning algorithm eliminates non essential assist features. In one embodiment, a sensitivity based geometric segmentation algorithm enforces manufacturability constraints without sacrificing quality.

In a first step, all manufacturability restrictions are removed. This allows free-form movement of geometries, creation of new geometries and deletion of old geometries. Once the structure of the solution mask stabilizes, the medial axis of the mask geometries is identified. The medial axis lines are binned into two groups. The first, target medial axes, are those that originate from design geometries at the input. The rest belong to the assist feature medial axis.

Next the assist feature medial axis lines are ranked based on their visible distance from the design medial axis. This step is similar to identifying layers of assist features. At this step, assist features that are far from the design geometries are 'pruned' out.

The remaining medial axes are smoothened to reduce local irregularities.

Each of the straightened edges of the medial axes are then padded with 'meat' based on average distance of associated geometry from the first step of the optimization. The resulting layout is a simplified representation of the output from the first step.

Next, each edge is segmented into smaller parts such that they can move like in traditional OPC. The size and density of such segments is determined locally for each edge of the simplified geometry based on a local optimization history from the first optimization set. This leads to non uniform segmentation and provides the necessary freedom for the second optimization loop. Finally, the second optimization loop is run with standard methods of enforcing manufacturability constraints during correction.

Figure 1:
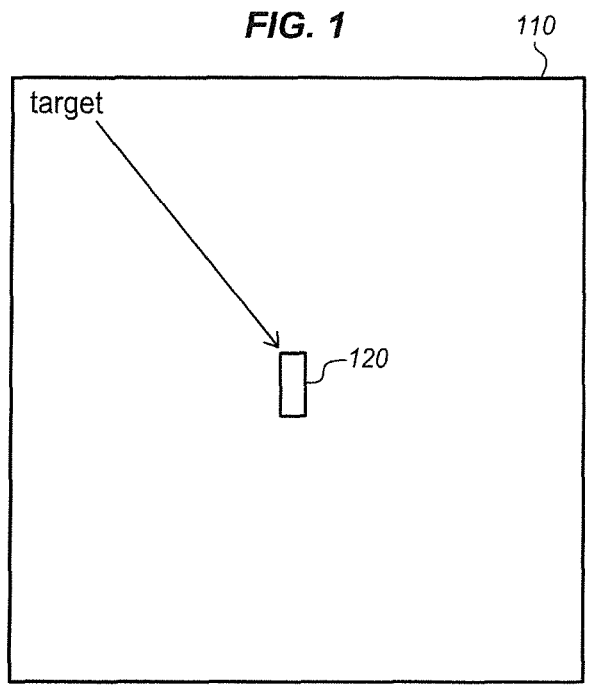
FIG. 1 is diagram of a feature on a photolithography mask in a target design.

FIG. 1 shows a diagram of a portion of a target mask design 110 the mask design includes only a single feature 120 shown as a rectangular feature in the center of this portion of the mask. In any actual mask design there may be thousands or millions of features in any of a variety of different possible configurations and arrays. The simple one feature diagram is shown in order to simplify understanding of the present invention and is provided as an example only. Initially, starting with the target design 110, an optimization process is performed. This optimization can be performed with all of the optimization restrictions removed. Concerns about manufacturability can be ignored in order to allow a free movement of geometries, the creation of new geometries, and the deletion of old geometries. The optimization may be an OPC optimization or an ILT optimization. A variety of different possible optimizations may be used depending on the particular implementation. The optimizations may be iterative or a single pass through.

Figure 2:
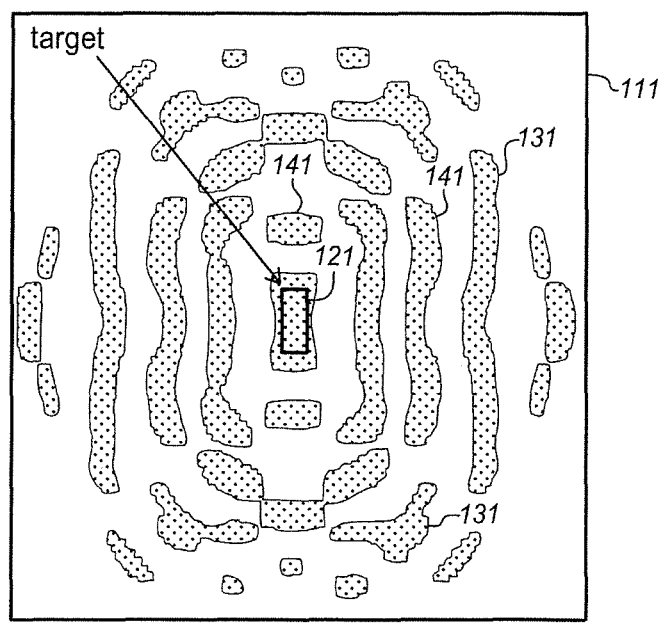
FIG. 2 is diagram of the photolithography mask design after an optimization process according to an embodiment of the invention.

FIG. 2 shows a diagram of an example of an optimization that might be obtained for the design feature 120 of FIG. 1. FIG. 2, accordingly, is a portion of an intermediate mask design 111 with a single design feature 121 at its center and a large number of additional assist features surrounding the single feature. In the illustrated example, the assist features are sub-resolution assist features and will not result in a printed feature on the photoresist. Their purpose is to assist in better printing the design feature 121.

As shown in FIG. 2, without constraints on the optimization process, many assist features are generated. There are assist features 141 near to the target feature 121 and additional assist features 131 further out from the target feature 121. The particular features shown in FIG. 2 are provided as examples only in order to illustrate aspects of the present invention. The mask design 111 of FIG. 2 is suggested by a particular example optimization process as an optimal mask for printing the single central feature 120 in the selected photolithography process. A different optimization process and a different photolithography process may generate a different mask. Different features will also cause the generation of a different mask.

While the mask may be optimal for printing the feature, it may not be easy to manufacture. The mask design of FIG. 2 includes many odd shapes and curved features 131, 141 which are difficult to produce using conventional mask printing processes. These features can be simplified as described below.

Figure 3:
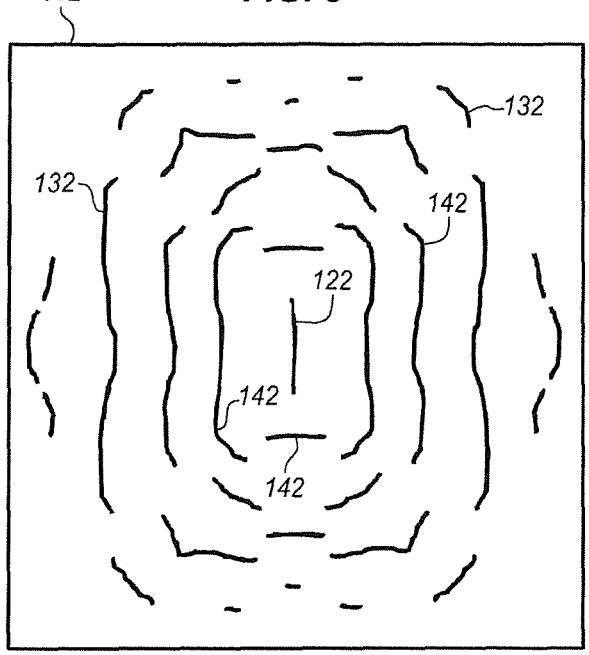
FIG. 3 is diagram of the photolithography mask design of FIG. 2 after identifying medial axes according to an embodiment of the invention.

In FIG. 3 the medial axis of each of the features has been identified and an intermediate mask diagram 112 shows these axes as lines indicated on the diagram 112. Accordingly, the central line 122 represents the medial axis for the target design feature 121. This line is the backbone of the design feature. In addition, for each of the assist features 131 141 their medial axes are also identified 132 142.

The assist features can be binned into three different groups. The first group of lines is the target feature 122. While this example shows only one target feature, there may be thousands or millions. The second group of lines is the assist features 142 near the central target feature, and the third group of lines are those more remote features 132. The lines of FIG. 3 may all be identified with a particular feature of FIG. 2 by overlaying the diagram 112 of FIG. 3 on the mask design 111 of FIG. 2.

Having identified the medial axis of each of the features, the lines can be ranked based on the distance from the target feature 121 this may be done using a visual analysis technique or in a variety of other ways depending on the particular implementation. In one example, lines 141 131 of the mask design are counted out from the central feature 122 some number of lines are kept while lines beyond that count are pruned out. Alternatively, a particular distance may be used. As a result, lines within that distance are kept and lines outside that distance are pruned off.

Figure 4:
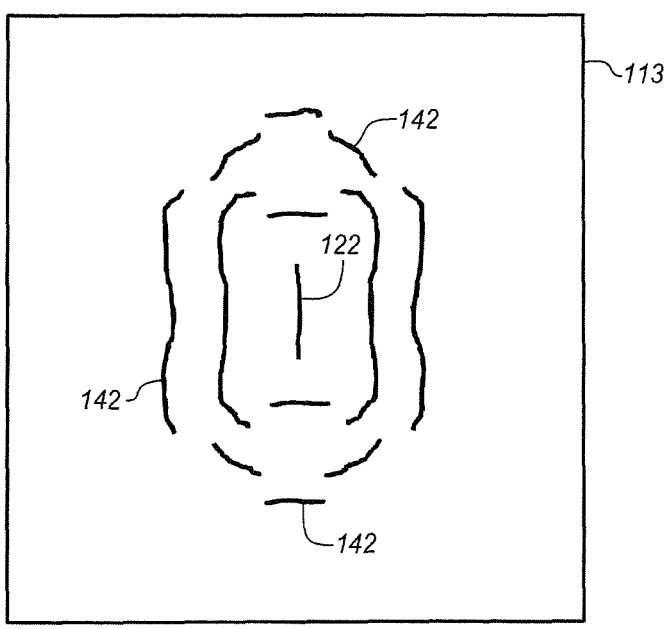
FIG. 4 is diagram of the photolithography mask design of FIG. 3 after pruning some of the medial axes according to an embodiment of the invention.

FIG. 4 shows the medial axis lines 122, 142 of FIG. 3 after the outer lines 132 have been pruned off. What remains in the diagram of the mask 113 of FIG. 4 is a central target feature 122 indicated by its medial axis and a small number of remaining assist features 142 surrounding the target feature 122. The particular number of medial axis lines to be kept and the number to be removed may be determined by simulating different levels of pruning until the intended number is obtained. Typically, as outer assist features are removed from the mask design, the quality with which the design feature 120 is printed degrades. As the outer most features are removed, the quality of the central feature is degraded only a little and, as more and more features are removed, the quality of the printing of the central feature is made steadily worse.

The number of assist features required to obtain sufficient accuracy in printing the design feature may be determined by simulating printing the feature with differing numbers of assist features until a desired result is obtained. The selected number balances simplicity in the mask with accuracy in printing the design feature. The number of assist features to print may also be varied depending upon the density of features in a particular portion of the mask, the particular process chemistry being used in the photolithography, and whether the feature is in higher or lower layers in an integrated device.

As shown in FIG. 4 the outer features have been pruned out from the design. In this example, only two rows of assist features remain. This may be determined by counting out two rows from the design feature or by measuring a selected distance from the design feature. The number of lines may be counted in different ways. In one example, orders are assigned to distance from the design feature. The closest line may be a first order and so on outwards. In such a case the upper and lower assist feature lines of FIG. 4 might be fourth order lines and fifth and higher order lines have been pruned.

After the lines for the outer assist features have been pruned. The remaining lines are smoothened to reduce local irregularities. This can be done by rounding values in the matrix of the proposed mask design, by aligning portions of lines that are near to each other, by using various fitting techniques to fit lines together or to fit lines to an underlying pattern, or in a variety of other ways.

Figure 5:
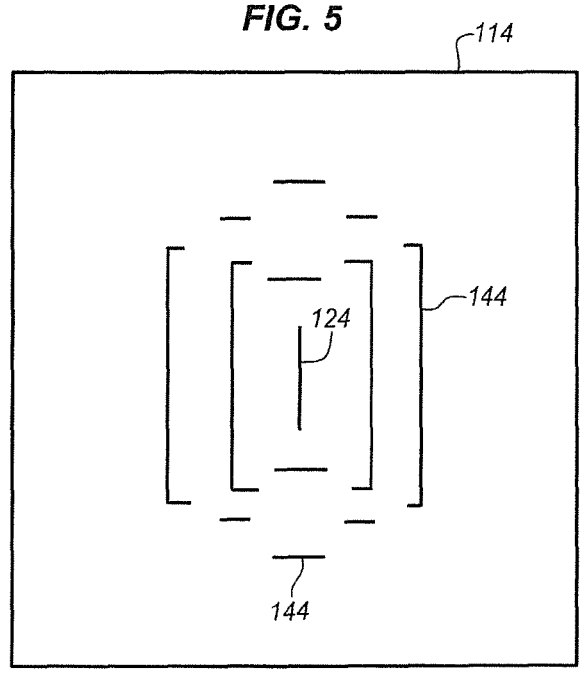
FIG. 5 is diagram of the photolithography mask design of FIG. 4 after simplifying the pruned medial axes according to an embodiment of the invention.

As shown in FIG. 5, the medial axis lines of the remaining features have been aligned on a horizontal and vertical pair of axes. The mask diagram 114 now includes a single very straight central backbone of the target feature 124 surrounded by straightened and aligned assist features 144. A mask based on these features is very well suited to printing using typical pixel based techniques. Typically, an electron beam will shoot rectangular tiles onto the mask so that all of the mask features are composed of a large number of small rectangular tiles that are horizontally and vertically aligned.

However since each of the lines 144 124 of the idealized masked diagram 114 of FIG. 5 represent only the medial axis of each feature on the mask, these lines may be far too thin to accurately print the intended target feature 120. Accordingly, each of the straightened edges of the medial axis can then be padded or thickened. The padding may be based on thicknesses of the associated geometry shown in FIG. 2. Each of the features in the initial mask design 111 has a thickness which may or may not vary across its length. This thickness may be measured and stored in memory and then used to determine a thickness to be applied to each of the lines 144 of FIG. 5.

Figure 6:
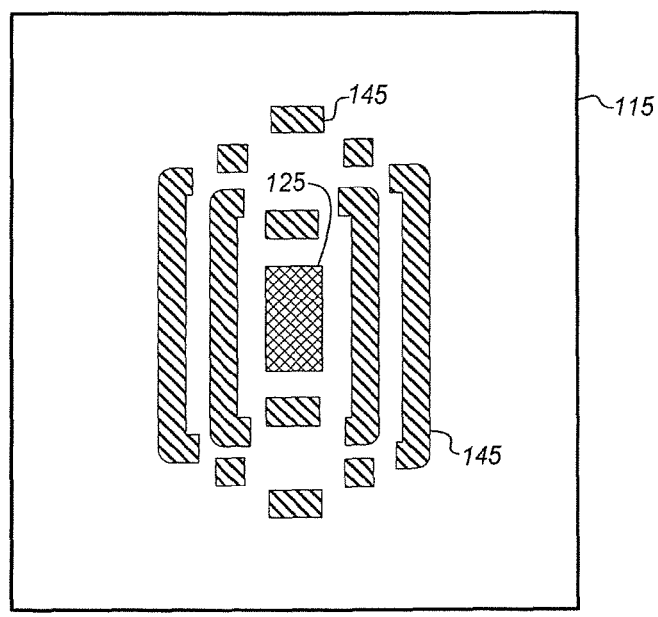
FIG. 6 is diagram of the photolithography mask design of FIG. 5 after padding the pruned medial axes according to an embodiment of the invention.

FIG. 6 shows the same features as in FIG. 5, but thickened. In effect, the medial axis line 124 of the target feature has been converted into a mask design shape 125, suitable for printing the entire feature rather than just its medial axis. The other assist features 144 have also been thickened to produce a mask design 145 which may be used to print the central target feature. The result is a simplified representation of the output of the first optimization. Comparing FIG. 6 to FIG. 2, the same central design feature 125 is shown surrounded by a simplified horizontal and vertical version of the more complex assist features of FIG. 2.

The mask design 115 of FIG. 6 may be used directly to print the intended feature 120. This design is simpler to generate on a mask and will result in a similar level of accuracy. For even better results a further optimization process may be applied to the mask design 115 of FIG. 6. In order to do this some level of freedom must be imposed upon the design.

Figure 7:
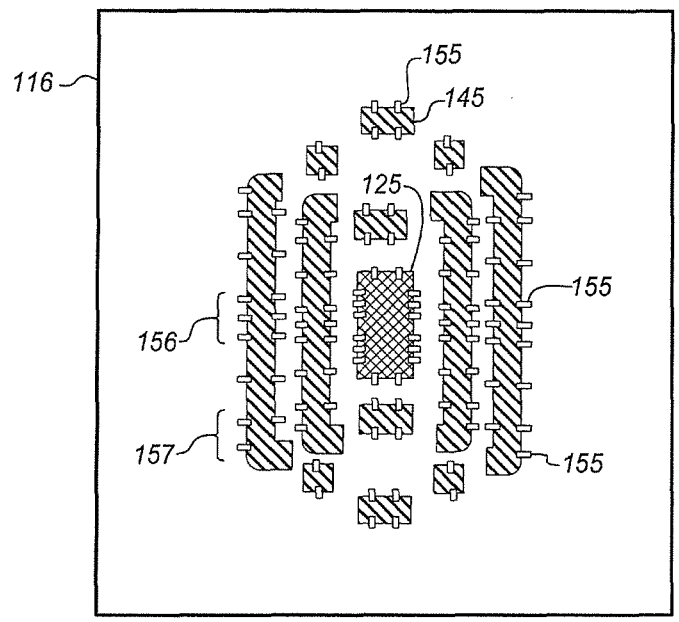
FIG. 7 is diagram of the photolithography mask design of FIG. 6 after segmenting the simplified medial axes according to an embodiment of the invention.

In FIG. 7, each edge of FIG. 6 has been segmented into smaller parts so that they can move as is normally done in a traditional optimization process, such as OPC. The size and density of each of the segments may be determined locally for each of the edges. This may be done based on a local optimization history based on the initial mask design 111 of FIG. 2. The resulting segmentation will not be uniform and will provide the desired freedom for another optimization loop.

Referring to FIG. 7, the design feature 125 is maintained as are the assist features 145 however, these have been divided into a number of segments 155. The size of the segments depends on the complexity of the original feature after the first optimization shown in FIG. 2. As a result, a central portion 156 of the left side assist feature 155 has three segments in the same space that a lower portion 157 of the same assist feature has only two segments. The segments may be determined by local searches. For example at each location the density of the original design at that location can be determined and this density may be related to a function to determine the relative number or size of segments in that location. This allows more freedom of movement where the density of the feature is high and less movement where less movement is necessary as determined by the initial optimization.

Figure 8:
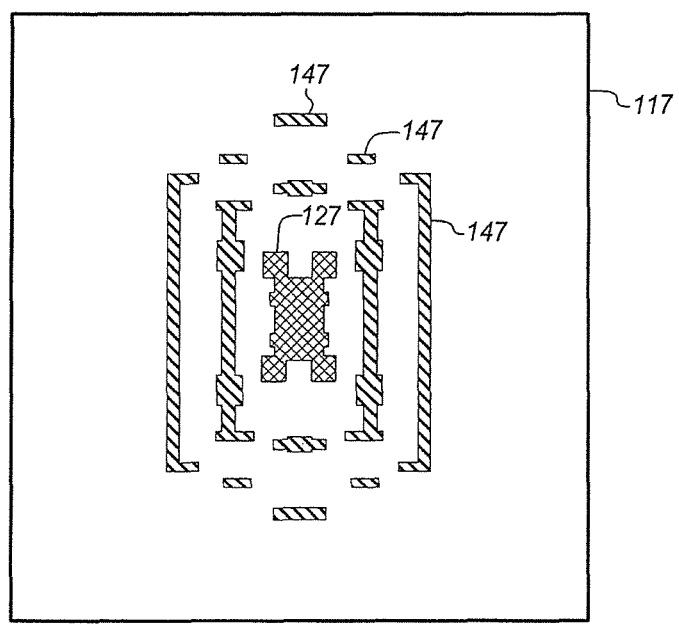
FIG. 8 is diagram of a finalized photolithography mask design of after an additional optimization process.

In contrast to the first optimization where restraints where largely removed, during this optimization a much more constrained optimization may be performed. By constraining this optimization, it is more likely that the resulting mask is still easy to manufacture. FIG. 8 shows an example of a mask design 117 after an optimization has been performed. The manufacturing restraints have ensured that the design feature 127 is still formed by rectangular tiles that can be presented with only horizontal and vertical shapes. Similarly, the assist features 147 are also represented as simple combinations of rectangular tiles. This mask may then be easily produced with an accuracy sufficient for reliably printing the design feature 120 with photolithography.

Figure 9:
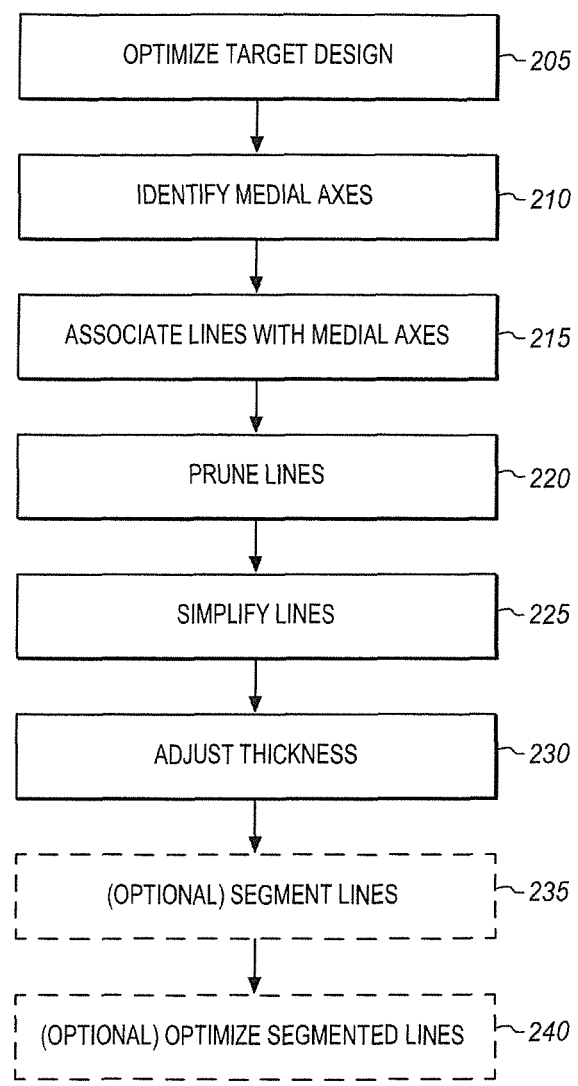
FIG. 9 is a process flow diagram of modifying a mask design according to an embodiment of the invention.

In FIG. 9 a process flow diagram of simplifying a mask design is shown. First, a target design is received. As described above, this may correspond to the design of FIG. 1 showing a central feature. For an actual mask 110 there would be a large number of features arrayed in an intended pattern to constitute the structures and circuitry that are desired by the mask designer. At 205, optimization is applied to this target design. The optimization will result in a number of design features and assist features for a proposed mask in an intermediate stage. In order to simplify this mask, at 210, the medial axes of all of the features or many of the features are identified. In one example, only medial axes of features larger than a certain size are identified.

At 210, each of these identified medial axes are represented as lines and associated with particular features in the original mask design 111. Based on this association the central target feature 120 can be identified and distinguished from assist features such as sub-resolution assist features.

At 220 some of the lines are pruned from the diagram of medial axis lines. This may be done by selecting lines within a particular distance from the target feature or a design feature. Alternatively, it may be done by pruning lines that are greater than a selected number of lines away from a respective design feature. As a further alternative, orders may be assigned wherein the first order is the closest line, a second order is the next closest lines, a third order is outside the lines of the second order and so on. A certain number of orders may be selected based on experimentation or simulation and then all lines beyond that selected order may be removed from the diagram of medial axis.

After a certain number of lines have been pruned these are then rendered back into actual mask printing features. The resulting mask may then be used in photolithography to print the target feature. At 225, the lines may be simplified into simple horizontal and vertical design lines that are well adapted for mask printing technology. At 230, the thickness of these lines may be adjusted to now be useful for printing the design feature.

The thickness of the lines may be based on the thickness of the original lines of the mask after optimization or based on a different methodology. The resulting mask may be used for photolithography or it may optionally be further optimized.

As shown in FIG. 9, for optimization the thickened lines may be segmented into smaller pieces or parts. In one example, the lines are segmented by determining a local size of a portion of a line from the original mask design after optimization and then segmenting that portion of the line with a density based on that determined local size.

At 240, the mask design with segmented lines may then be optimized using any of a variety of different optimization techniques to produce a further optimized mask. As explained above, in the initial optimization at 205 there are few or no restraints on the resulting mask design. This results in a mask that may be difficult to produce using mask printing technology. On the other hand, in the second optimization 240 strict restraints may be used to ensure that the resulting optimized mask is producible using mask printing technology. As a result, an optimized mask is obtained that is still able to be produced simply and easily.

Figure 10:
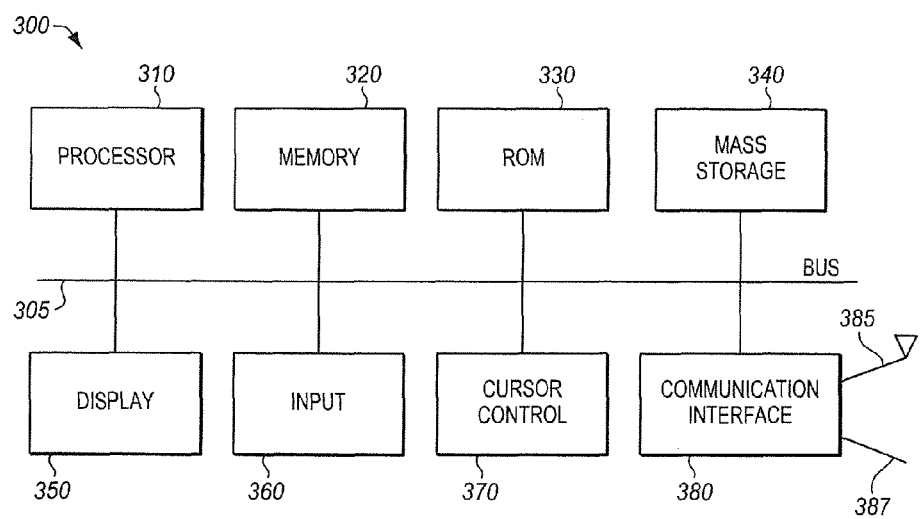
FIG. 10 is a block diagram of a computing system suitable for implementing embodiments of the invention.

FIG. 10 is a block diagram of one embodiment of an electronic system that may be used to implement the process flow diagram of FIG. 9. Alternative systems may include more, fewer, or different components. Systems such as that illustrated may be coupled together to provide multiple computing nodes.

Electronic system 300 includes a bus 305 or other communications device to communicate information, and a processor 310 coupled to the bus 305 to process information. While the electronic system 300 is illustrated with a single processor, the electronic system 300 may include multiple processors or co-processors. The electronic system 300 further includes a random access memory (RAM) or other dynamic storage device 320 (referred to as memory), coupled to the bus 305 to store information and instructions to be executed by the processor 310. The memory 320 also may be used to store temporary variables or other intermediate information during execution of instructions by the processor 310.

The electronic system 300 also includes a read only memory (ROM) and/or other static storage device 330 coupled to bus 305 to store static information and instructions for the processor 310. A data storage device 340 is coupled to the bus 305 to store information and instructions.

The electronic system 300 may also be coupled via the bus 305 to a display device 350, such as a light emitting diode (LED) or liquid crystal display (LCD), to display information to a user. An input device 360, including alphanumeric and other keys, is typically coupled to the bus 305 to communicate information and command selections to the processor 310. Another type of user input device is a cursor control 370, such as a mouse, a trackball, or cursor direction keys to communicate direction information and command selections to the processor 310 and to control cursor movement on a display 350. The electronic system 300 further includes a network interface 380, such as a wired network interface 387 or a wireless network interface 385 to provide access to a network, such as a local area network.

Instructions are provided to memory from a storage device, such as magnetic disk, a read-only memory (ROM) integrated circuit, CD-ROM, DVD, via a remote connection (e.g., over a wired or wireless network via the network interface) providing access to one or more electronically-accessible media, etc. In alternative embodiments, hard-wired circuitry may be used in place of or in combination with software instructions. Thus, execution of sequences of instructions is not limited to any specific combination of hardware circuitry and software instructions.

A computer-readable medium includes any mechanism that provides (i.e., stores and/or transmits) content (e.g., computer executable instructions) in a form readable by an electronic device (e.g., a computer, a personal digital assistant, a cellular telephone). For example, a computer-readable medium may include read only memory (ROM), random access memory (RAM), magnetic disk storage media; optical storage media; or flash memory devices, etc.

Methods and apparatuses are described herein with respect to integrated circuit manufacturing; however, the techniques described may be applied to the manufacturing and/or design process of any integrated device. Integrated devices include integrated circuits, micromachines, thin film structures such as disk drive heads, gene chips, micro-electromechanical systems (MEMS), or any other article of manufacture that is manufactured using lithography techniques.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

The above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. A method comprising:
   optimizing a target mask design for a photolithography mask, the target mask design being stored in a memory of a computer and comprising a plurality of design features, the optimized design having a plurality of assist features to print at least a portion of the design features;
   identifying medial axes of the design and assist features on the optimized mask as lines using the computer;
   associating design and assist features on the optimized mask with the lines using the computer;
   pruning lines that are distant from a respective design feature using the computer;
   simplifying the lines that are not pruned using the computer; and
   thickening the simplified lines to form assist features using the computer.

2. The method of claim 1, wherein optimizing a target design comprises applying inverse lithography.

3. The method of claim 1, wherein pruning lines comprises selecting lines that are within a selected distance from the respective design feature and pruning all other lines.

4. The method of claim 1, wherein pruning lines comprises pruning lines that are greater than a selected number of lines from the respective associated design feature.

5. The method of claim 1, wherein pruning, lines comprises pruning sub-resolution assist features beyond a selected order from the respective associated design feature.

6. The method of claim 1, wherein simplifying comprises simplifying the lines that are not pruned to vertical and horizontal components.

7. The method of claim 1, wherein simplifying comprises simplifying the lines that are not pruned for mask production techniques.

8. The method of claim 1, wherein thickening comprises adjusting the thickness of the simplified lines based on the thickness of the assist features of the optimized design.

9. The method of claim 1, further comprising:
   segmenting the remaining lines into smaller parts; and
   optimizing the remaining segmented lines to form an improved mask to print the target design.

10. The method of claim 9, wherein segmenting the lines comprises selecting a portion of a line determining a local size of an assist feature of the optimized design corresponding to the selected portion of the line and segmenting the portion of the line with a density based on the determined local size.

11. The method of claim 9, wherein optimizing the remaining segmented lines comprises applying inverse lithography.

12. A non-transitory computer-readable medium having instructions that, when operated on by the computer, cause the computer to perform operations comprising:
   optimizing a target mask design for a photolithography mask, the target mask design comprising a plurality of design features, the optimized design having a plurality of assist features to print at least a portion of the design features;
   identifying medial axes of the design and assist features on the optimized mask as lines;
   associating design and assist features on the optimized mask with the lines;
   pruning lines that are distant from a respective design feature;
   simplifying the lines that are not pruned; and
   thickening the simplified lines to form assist features.

13. The medium of claim 12, wherein pruning lines comprises selecting lines that are within a selected distance from the respective design feature and pruning all other lines.

14. The medium of claim 12, wherein simplifying comprises simplifying the lines that are not pruned to vertical and horizontal components.

15. The medium of claim 12, wherein thickening comprises adjusting the thickness of the simplified lines based on the thickness of the assist features of the optimized design.

16. A photolithography mask generated by:
   optimizing a target mask design for a photolithography mask, the target mask design comprising a plurality of design features, the optimized design having a plurality of assist features to print at least a portion of the design features;

identifying medial axes of the design and assist features on the optimized mask as lines;

associating design and assist features on the optimized mask with the lines;

pruning lines that are distant from a respective design feature;

simplifying the lines that are not pruned; and thickening the simplified lines to form assist features.

17. The mask of claim 16, wherein pruning lines comprises pruning lines that are greater than a selected number of lines from the respective associated design feature.

18. The mask of claim 16, wherein pruning lines comprises pruning sub-resolution assist features beyond a selected order from the respective associated design feature.

19. The mask of claim 16, further generated by segmenting the remaining lines into smaller parts and optimizing the remaining segmented lines to form an improved mask to print the target design.

20. The mask of claim 19, wherein segmenting the lines comprises selecting a portion of a line determining a local size of an assist feature of the optimized design corresponding to the selected portion of the line and segmenting the portion of the line with a density based on the determined local size.

* * * * *